United States Patent [19]

Tomita et al.

[11] Patent Number: 5,757,063
[45] Date of Patent: May 26, 1998

[54] SEMICONDUCTOR DEVICE HAVING AN EXTRINSIC GETTERING FILM

[75] Inventors: Hiroshi Tomita; Mami Takahashi, both of Yokohama; Kikuo Yamabe, Ibaraki-ken, all of Japan

[73] Assignee: Kabushiki Kaisha Toshiba, Kawasaka, Japan

[21] Appl. No.: 730,322

[22] Filed: Oct. 11, 1996

Related U.S. Application Data

[63] Continuation-in-part of Ser. No. 667,884, Jun. 20, 1996, Pat. No. 5,698,891, which is a continuation of Ser. No. 408,880, Mar. 24, 1995, abandoned.

[30] Foreign Application Priority Data

Mar. 25, 1994 [JP] Japan .................. 6-054299

[51] Int. Cl.$^6$ .................. H07L 21/322
[52] U.S. Cl. .................. 257/610; 257/617; 257/913; 438/471; 438/476
[58] Field of Search .................. 257/610–612, 257/617, 913, 131; 438/471, 476

[56] References Cited

U.S. PATENT DOCUMENTS

| | | | |
|---|---|---|---|
| 4,053,335 | 10/1977 | Hu | 148/174 |
| 4,608,096 | 8/1986 | Hill | 148/33 |
| 4,716,451 | 12/1987 | Hsu et al. | 257/610 |
| 5,327,007 | 7/1994 | Imura et al. | 257/913 |
| 5,360,748 | 11/1994 | Nadahara et al. | 438/476 |
| 5,397,903 | 3/1995 | Hirose | 257/913 |

FOREIGN PATENT DOCUMENTS

| | | |
|---|---|---|
| 54-69964 | 5/1954 | Japan . |
| 60-117738 | 6/1985 | Japan . |
| 60-119733 | 6/1985 | Japan . |
| 4-42540 | 2/1992 | Japan . |
| 4-218921 | 8/1992 | Japan . |

Primary Examiner—Tom Thomas
Assistant Examiner—David B. Hardy
Attorney, Agent, or Firm—Finnegan, Henderson, Farabow, Garrett & Dunner, L.L.P.

[57] ABSTRACT

A semiconductor device includes a semiconductor substrate having first and second main surfaces and including a denuded zone, in which an oxygen concentration is lower than that in an inner portion of the semiconductor substrate and which does not include a bulk microdefect, and an intrinsic gettering zone, and element region formed on the first surface of the semiconductor substrate, and an extrinsic gettering layer, made of an amorphous semiconductor material which traps a metal impurity, and formed directly on at least a portion of the intrinsic gettering region or the denuded zone entirely or partially thinned of the second main surface of the semiconductor substrate. A method for manufacturing a semiconductor device includes the steps of forming an element region on a first main surface of a semiconductor substrate having first and second main surfaces and having an intrinsic gettering zone, and forming an extrinsic gettering layer, made of an amorphous semiconductor material which traps a metal impurity, directly on at least a portion of the intrinsic gettering region of the second main surface of the semiconductor substrate.

7 Claims, 13 Drawing Sheets

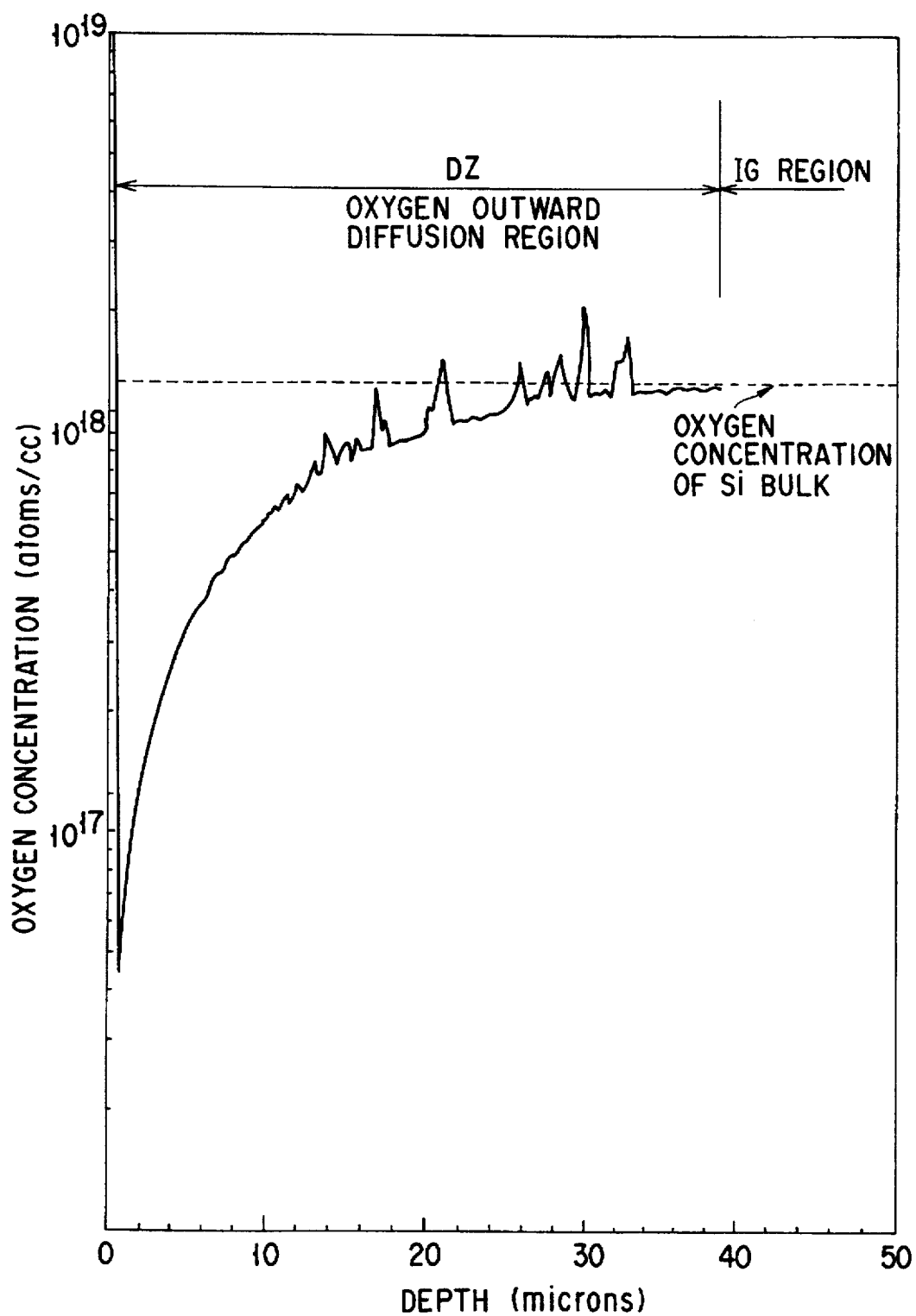
F I G. 1

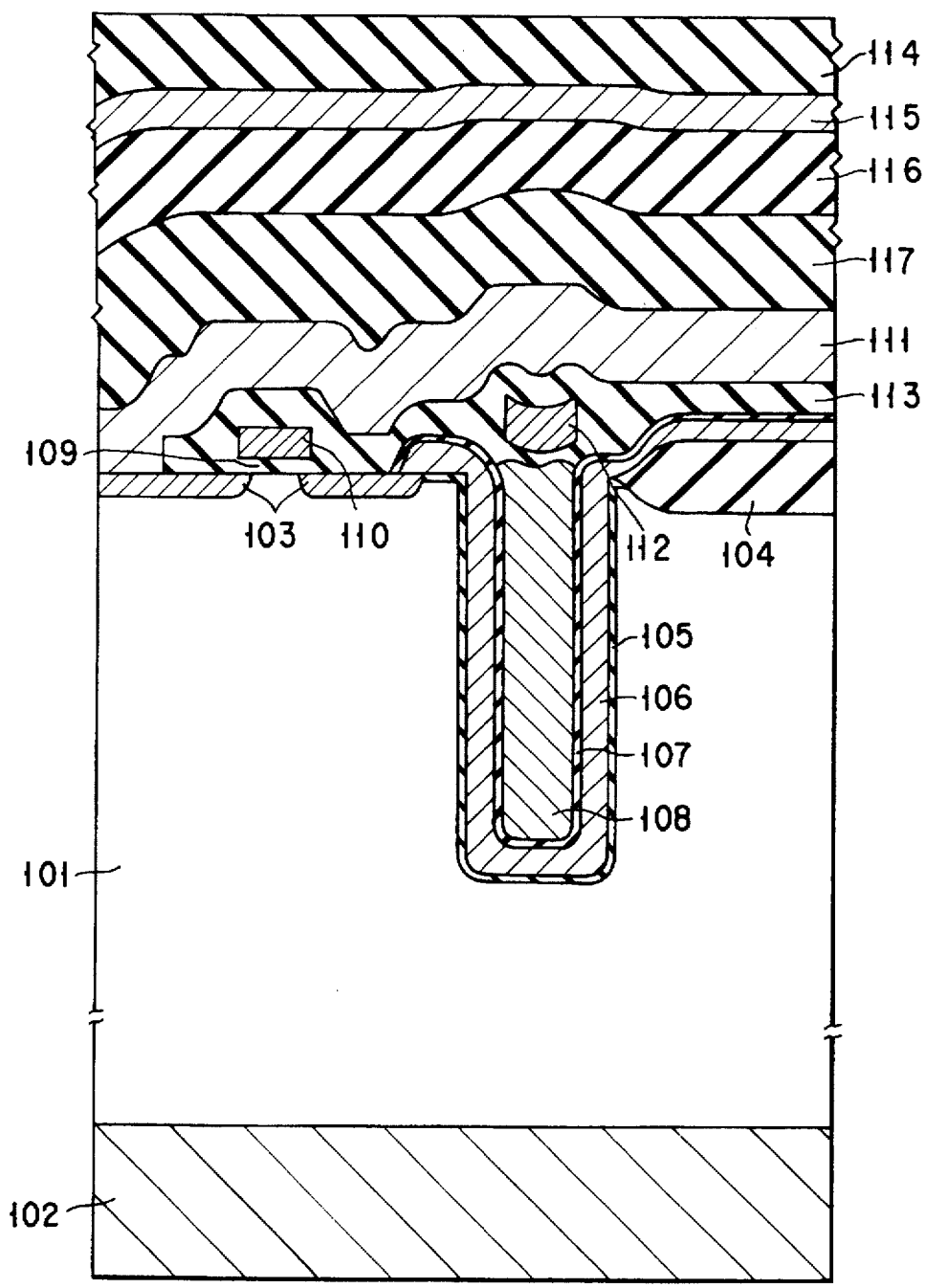
F I G. 2

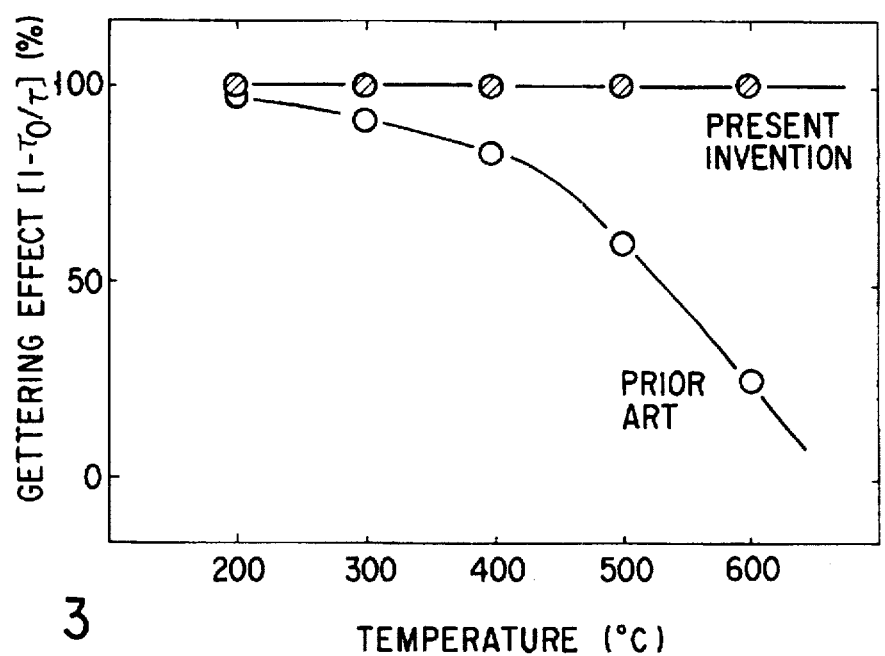
FIG. 3
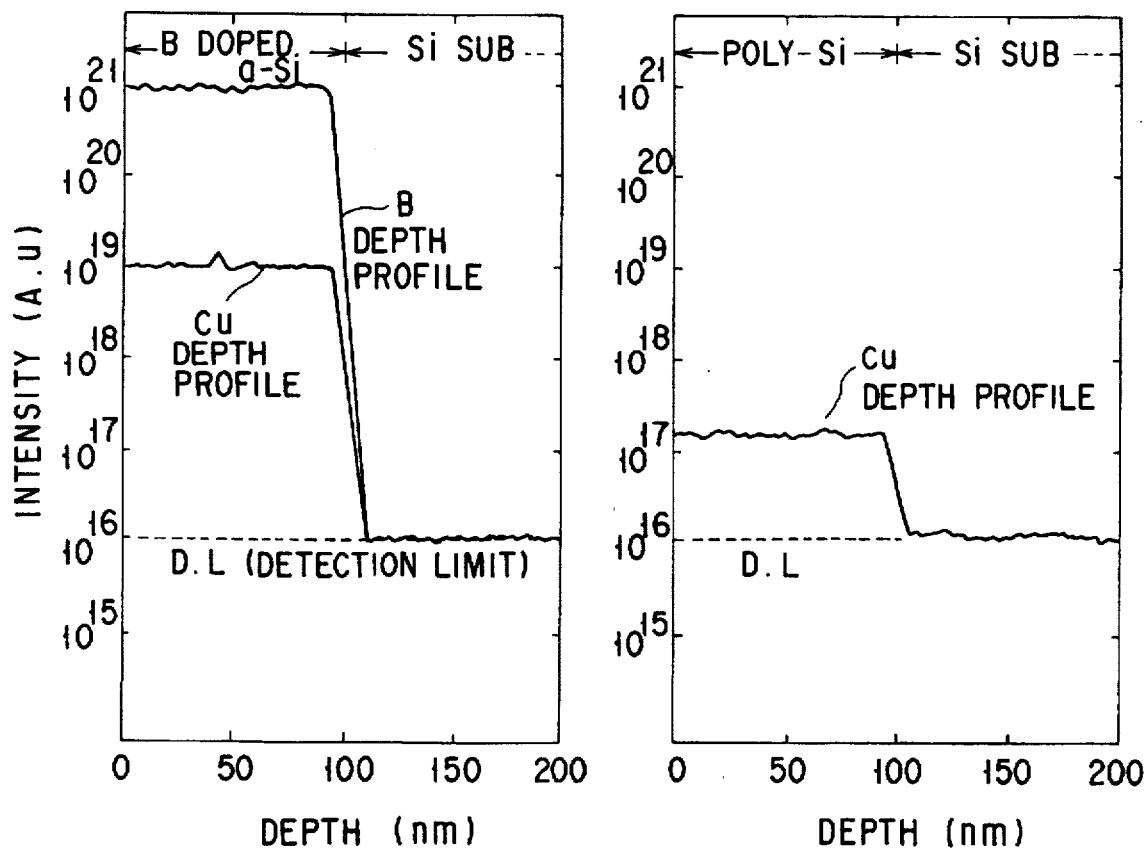
FIG. 4A
FIG. 4B

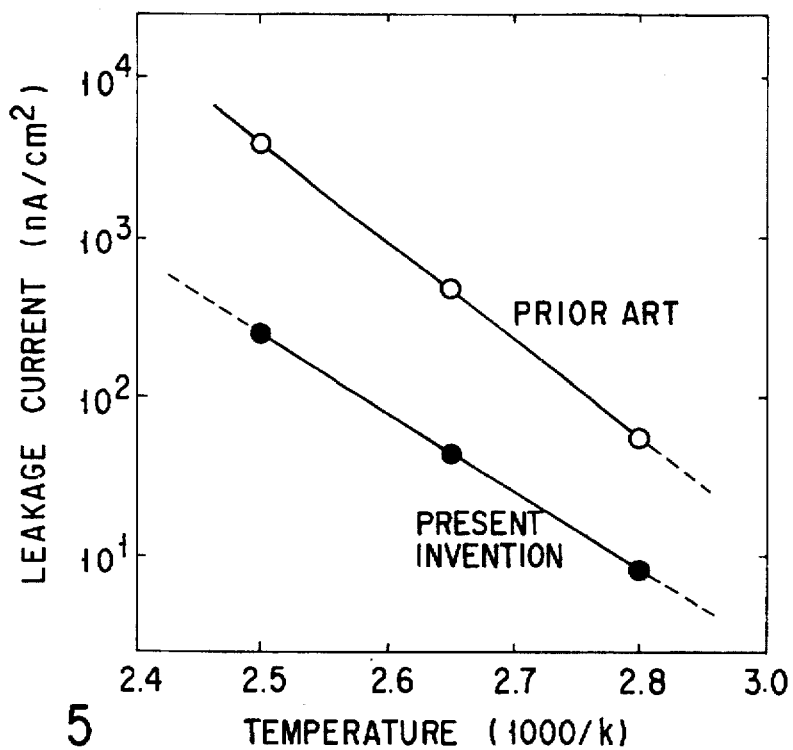
F I G. 5
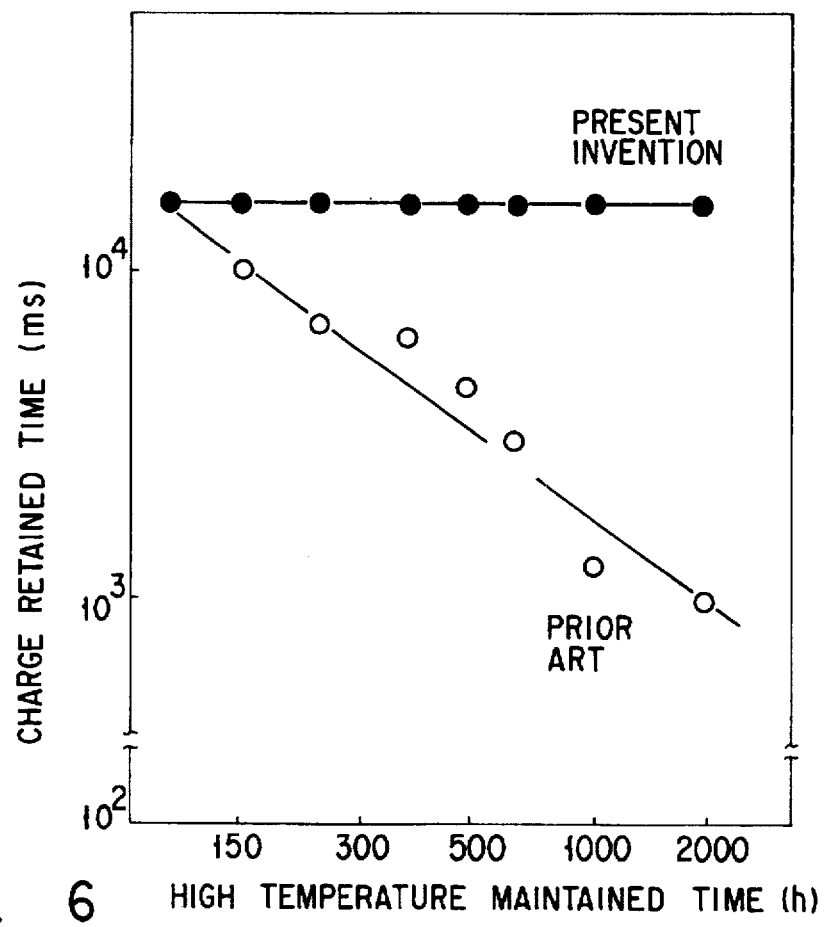
F I G. 6

F I G. 12A
F I G. 12B
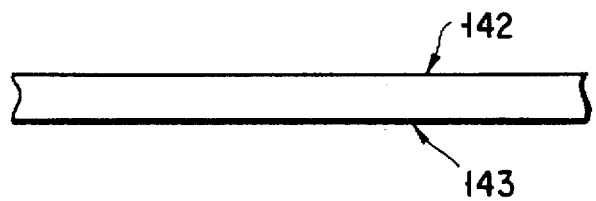
F I G. 12C
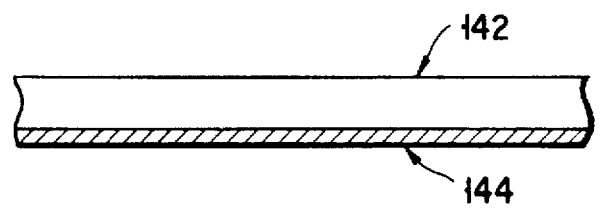
F I G. 12D
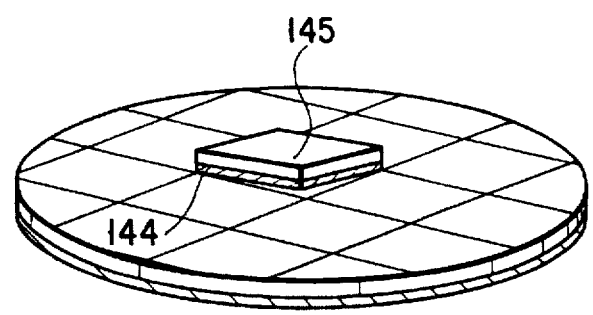
F I G. 12E
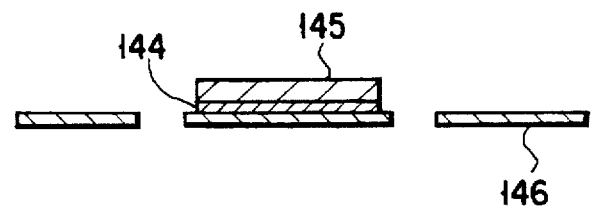
F I G. 12F
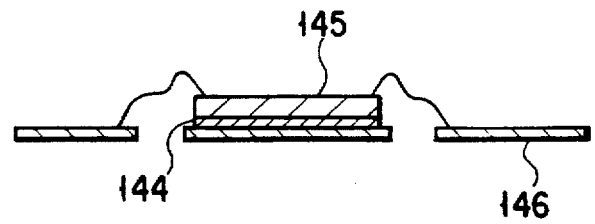

| Tpause | Current | Total |
|---|---|---|
| 10.00mS | 0 | 0 |
| 12.58mS | 2 | 2 |
| 15.84mS | 0 | 2 |
| 19.95mS | 0 | 2 |
| 25.11mS | 0 | 2 |
| 31.62mS | 0 | 2 |
| 39.81mS | 0 | 2 |
| 50.11mS | 0 | 2 |
| 63.09mS | 0 | 2 |
| 79.43mS | 0 | 2 |
| 100.0mS | 0 | 2 |
| 125.8mS | 0 | 2 |
| 158.4mS | 0 | 2 |
| 199.5mS | 0 | 2 |
| 251.1mS | 0 | 2 |
| 316.2mS | 0 | 2 |
| 398.1mS | 2 | 4 |
| 501.1mS | 11 | 15 |
| 630.9mS | 22 | 37 |
| 794.3mS | 41 | 78 |
| 1.000S | 48 | 126 |

FAILURE BIT

FIG. 14A

| Tpause | Current | Total |
|---|---|---|
| 10.00mS | 0 | 0 |
| 12.58mS | 0 | 0 |
| 15.84mS | 0 | 0 |
| 19.95mS | 0 | 0 |
| 25.11mS | 0 | 0 |
| 31.62mS | 0 | 0 |
| 39.81mS | 0 | 0 |
| 50.11mS | 0 | 0 |
| 63.09mS | 0 | 0 |
| 79.43mS | 0 | 0 |
| 100.0mS | 0 | 0 |
| 125.8mS | 0 | 0 |
| 158.4mS | 0 | 0 |
| 199.5mS | 0 | 0 |
| 251.1mS | 0 | 0 |
| 316.2mS | 0 | 0 |
| 398.1mS | 2 | 2 |
| 501.1mS | 10 | 12 |
| 630.9mS | 23 | 35 |
| 794.3mS | 42 | 77 |
| 1.000S | 48 | 125 |

FIG. 14B

| Tpause | Current | Total |
|---|---|---|
| 10.00mS | 8 | 8 |
| 12.58mS | 1 | 9 |
| 15.84mS | 0 | 9 |
| 19.95mS | 0 | 9 |
| 25.11mS | 0 | 9 |
| 31.62mS | 0 | 9 |
| 39.81mS | 0 | 9 |
| 50.11mS | 0 | 9 |
| 63.09mS | 0 | 9 |
| 79.43mS | 0 | 9 |
| 100.0mS | 0 | 9 |
| 125.8mS | 0 | 9 |
| 158.4mS | 0 | 9 |
| 199.5mS | 0 | 9 |
| 251.1mS | 0 | 9 |
| 316.2mS | 0 | 9 |
| 398.1mS | 0 | 9 |
| 501.1mS | 4 | 13 |
| 630.9mS | 12 | 25 |
| 794.3mS | 29 | 54 |
| 1.000S | 40 | 94 |

FIG. 15A  BEFORE FORMING B DOPED AMORPHOUS SILICON FILM (FAILURE BIT indicated)

| Tpause | Current | Total |
|---|---|---|
| 10.00mS | 0 | 0 |
| 12.58mS | 0 | 0 |
| 15.84mS | 0 | 0 |
| 19.95mS | 0 | 0 |
| 25.11mS | 0 | 0 |
| 31.62mS | 0 | 0 |
| 39.81mS | 0 | 0 |
| 50.11mS | 0 | 0 |
| 63.09mS | 0 | 0 |
| 79.43mS | 0 | 0 |
| 100.0mS | 0 | 0 |
| 125.8mS | 0 | 0 |
| 158.4mS | 0 | 0 |
| 199.5mS | 0 | 0 |
| 251.1mS | 0 | 0 |
| 316.2mS | 0 | 0 |
| 398.1mS | 0 | 0 |
| 501.1mS | 5 | 5 |
| 630.9mS | 9 | 14 |
| 794.3mS | 25 | 39 |
| 1.000S | 36 | 75 |

FIG. 15B  AFTER FORMING B DOPED AMORPHOUS SILICON FILM

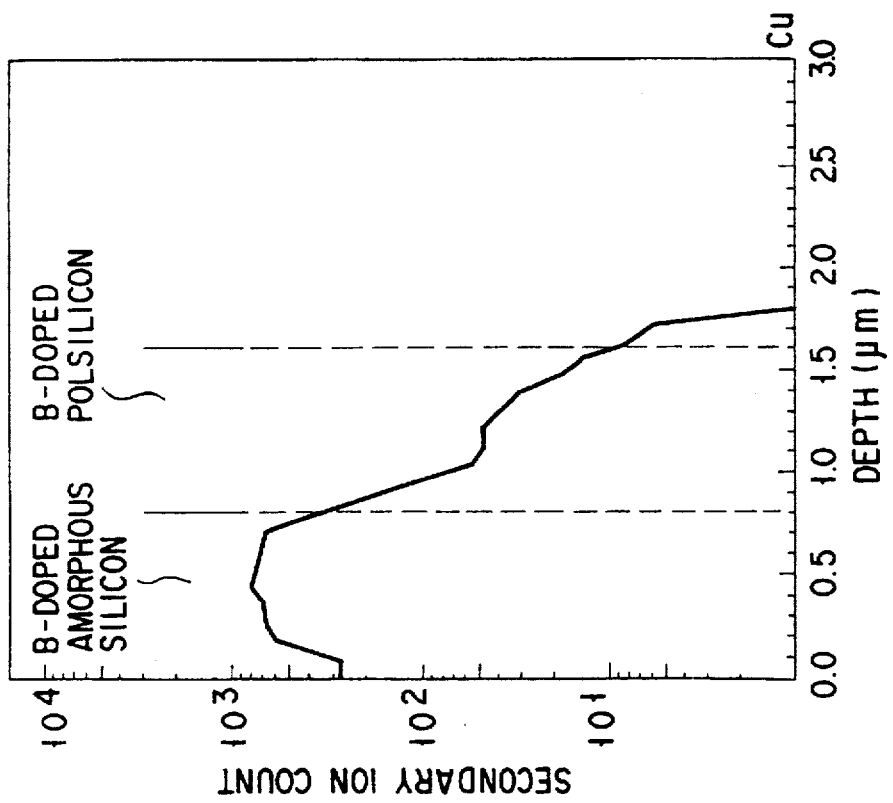
F I G. 16B
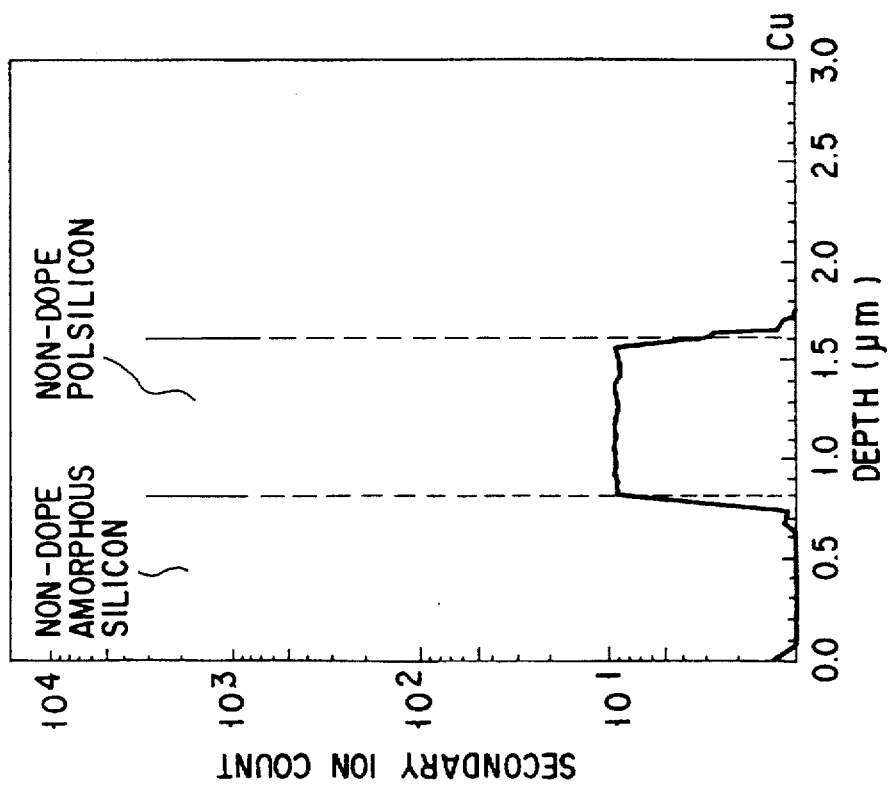
F I G. 16A

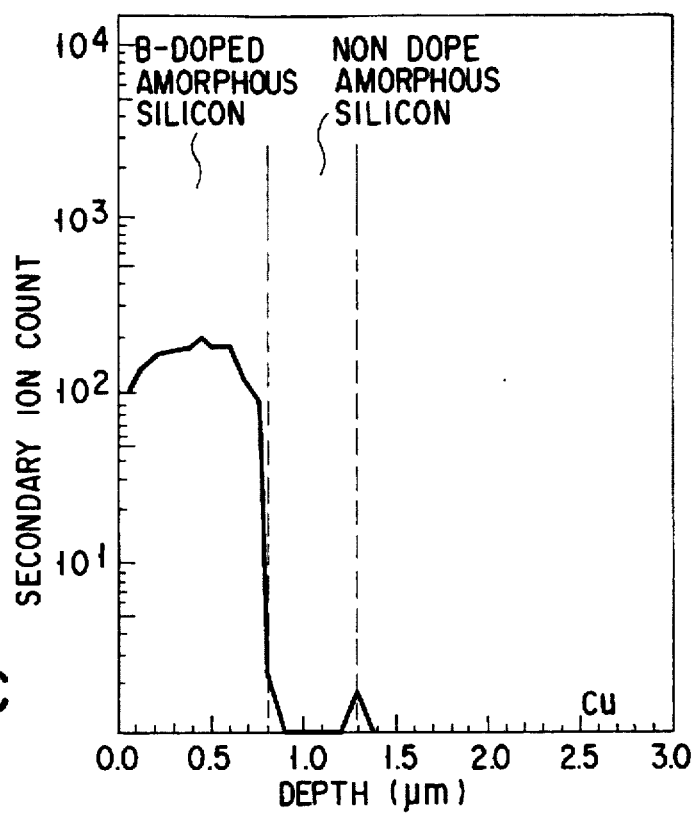
F I G. 16C
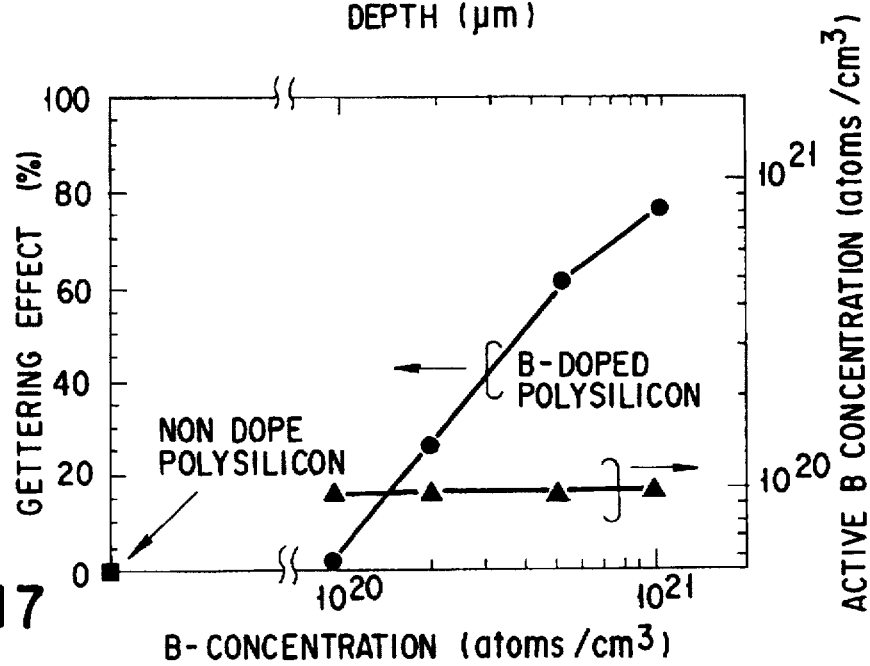
F I G. 17
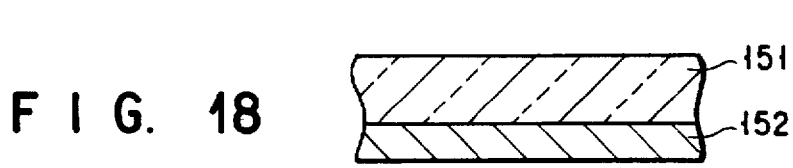
F I G. 18

1

SEMICONDUCTOR DEVICE HAVING AN EXTRINSIC GETTERING FILM

CROSS-REFERENCE TO THE RELATED APPLICATIONS

This is a continuation-in-part of U.S. application Ser. No. 08/667,884, filed Jun. 20, 1996, now U.S. Pat. No. 5,698,891 which in turn is a continuation of U.S. application Ser. No. 08/408,880 filed Mar. 24, 1995, now abandoned.

BACKGROUND OF THE INVENTION

1. Field of the Invention

The present invention relates to a semiconductor device and a method for manufacturing the same, and more particularly to a semiconductor device and a method for manufacturing the same, in which contaminant is prevented from being mixed into an element forming region.

2. Description of the Related Art

In recent years, as the integration density of a semiconductor device has been increasing, various measures have been taken in order to improve the reliability of the device. One of the measures is to remove a metal impurity from a semiconductor substrate. During a process of manufacturing a semiconductor device or a long time use of the semiconductor device, a metal impurity may penetrate in a semiconductor element. The metal impurity forms a trap center of electrons or holes, which causes a leakage current at a pn junction and degrades electric characteristics of the semiconductor device. For example, when a metal (e.g., Fe, Cu, Ni, or Au) is fetched in an element forming region of a semiconductor substrate, various problems, such as reduction of the lifetime of a MOS, increase of the pn junction leak, and reduction of a memory holding time in a DRAM, may be raised. Further, it is reported that a metal impurity, penetrated in a gate oxide film or an interface between a silicon substrate and gate oxide film, degrades electrical characteristics (e.g., the withstand voltage and the leakage current) of the gate oxide film, resulting in that the defect density is increased. Particularly in a nonvolatile memory such as an EEPROM, a metal impurity even in an amount as little as $10^{10}$ atoms/cm$^2$ or less adversely influences the reliability of a tunnel oxide film.

As described above, a metal impurity causes degradation of electric characteristics of a semiconductor element. Particularly in manufacturing a ULSI, since even a small amount of contaminant degrades or changes the element characteristics, it adversely affects the manufacturing yield and the long term reliability of the element. It is therefore necessary to sufficiently remove an impurity of heavy metal or light metal penetrated in an element forming region in a surface region of the semiconductor substrate.

In general, contaminant of such a metal impurity is removed from the element forming region by etching or gettering.

In metal impurity removing methods by means of etching (the wet etching method or the dry etching method), a metal impurity can be removed from a surface region of a semiconductor substrate without etching the semiconductor substrate. However, a very small amount of a metal impurity diffused in the semiconductor substrate cannot be removed sufficiently.

Methods for removing a metal impurity by means of gettering without etching a substrate include intrinsic gettering (hereinafter abbreviated as IG) and extrinsic gettering (hereinafter abbreviated as EG).

The IG is a method in which an oxygen deposit is deposited near a bulk microdefect (BMD) by cooling a metal impurity super-saturated in a silicon substrate, from a high temperature state to a low temperature state. In this method, the silicon substrate (wafer) must include oxygen and a heat treatment for depositing the oxygen deposit is very important. More specifically, to deposit an oxygen deposit in an optimal state, it is necessary to manage the thermal history of the wafer in all the heat processes from a low temperature to a high temperature. Such a management requires a highly developed technology, when the dislocation intensity of the wafer (a measure of the wafer strength) is taken into account. Moreover, in the IG, substantially no gettering effect can be obtained in a high temperature state of 500° to 1000° C., although the effect depends on a solid solubility limit of the metal impurity. In a low temperature state, since deposition of a metal impurity in an element forming region is suppressed, the metal impurity cannot be selectively deposited only near a bulk microdefect.

Typical EGs include phosphorus gettering, wafer backside polysilicon gettering (BSP gettering) and so on. The phosphorus gettering is a method in which phosphor is diffused through the back surface of a wafer, thereby removing a metal impurity from an element forming region and selectivery depositing it in a phosphorus diffusion layer of a high concentration. In the phosphorus gettering, for example, POCl$_3$ is used as a material gas. In this case, a heat treatment process for heating the wafer to a high temperature of at least 800° C. is required to form a phosphorus diffusion layer of a high concentration, although the process depends on a solid solubility limit of phosphorus. The phosphorus gettering is therefore effective in a process including a heat treatment at a temperature of 800° C. or higher, but cannot be employed in a low temperature process in which a heat treatment at 800° C. or higher is not permitted.

The BSP gettering is a method in which a polysilicon film is formed on the back surface of a wafer and the wafer is cooled from a high temperature of 700° C. or higher to a room temperature, thereby depositing a metal impurity on a grain boundary in the polysilicon film. In this method, if the polysilicon film is formed on the back surface of the wafer, the metal impurity can be gotten in the first step of the manufacturing process. However, substantially no gettering effect can be obtained in a high temperature state of 600° C. or higher, although the effect depends on the amount of contaminant due to the metal impurity. Further, a metal impurity, having a great diffusion coefficient in a silicon substrate formed of Cu, Ni or the like, is deposited on the grain boundary of polysilicon by means of the BSP gettering. However, when the temperature of the silicon substrate rises, the metal impurity which has been trapped in a gettering site is discharged into the silicon substrate.

As described above, there is no gettering method effective in the current manufacturing process, particularly in the step of manufacturing a semiconductor device including a low-temperature process at 500° C. or lower executed before or after a step of forming a metal wire.

SUMMARY OF THE INVENTION

The present invention has been made in consideration of the above drawbacks of the conventional art.

Accordingly, an object of the present invention is to provide a semiconductor device having a higher thermal stability as compared to that in the conventional IG or BSP gettering (the amount of a metal impurity discharged at a high temperature is less than that in the IG or BSP gettering)

even in a low temperature process at 500° C. or lower executed after, for example, a step of forming a metal wiring, i.e., a process in which a heat treatment at a high temperature cannot be executed, and also having a much greater capacitance of a gettering site than that in the BSP gettering, and also to provide a method for manufacturing such a semiconductor device.

Another object of the present invention is to provide a semiconductor device, in which a metal impurity is prevented from penetrating into an element forming region for a long period of time and degradation of electric characteristics due to the penetration of the metal impurity is suppressed, and also to provide a method for manufacturing such a semiconductor device.

The above objects can be achieved by a semiconductor device comprising: a semiconductor substrate having first and second main surfaces and including a denuded zone, in which an oxygen concentration is lower than that in an inner portion of the semiconductor substrate and which does not include a bulk microdefect, and an intrinsic gettering zone; an element region formed on the first surface of the semiconductor substrate; and an extrinsic gettering layer, made of an amorphous semiconductor material which traps a metal impurity, and formed directly on at least a portion of the intrinsic gettering region of the second main surface of the semiconductor substrate.

The above object can also be achieved by a method for manufacturing a semiconductor device comprising the steps of: forming an element region on a first main surface of a semiconductor substrate having first and second main surfaces and including an intrinsic gettering zone; and forming an extrinsic gettering layer, made of an amorphous semiconductor material which traps a metal impurity, directly on at least a portion of the intrinsic gettering region of the second main surface of the semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a graph showing the result of a SIMS analysis representing the oxygen concentration;

FIG. 2 is a cross sectional view showing the basic structure of a semiconductor device according to a first embodiment of the present invention;

FIG. 3 is a graph showing the relationship between the temperature and the gettering effect;

FIG. 4A is a graph showing the result of a SIMS analysis representing the amount of Cu trapped by a semiconductor device of the present invention;

FIG. 4B is a graph showing the result of a SIMS analysis representing the amount of Cu trapped by the BPS gettering;

FIG. 5 is a graph showing the relationship between the temperature and the leakage current;

FIG. 6 is a graph showing the relationship between the charge retained time and the high temperature maintained time;

FIGS. 12A to 12F are diagrams for explaining the process shown in FIG. 10A;

FIG. 14A is a characteristic diagram showing a data retaining characteristic of a DRAM obtained by the process shown in FIG. 10B;

FIG. 14B is a characteristic diagram showing a data retaining characteristic of a DRAM obtained by the process shown in FIG. 10A;

FIGS. 15A and 15B are characteristic diagrams for explaining that a wafer can be remedied by the present invention;

FIG. 16A is a characteristic diagram for comparing the copper (Cu) gettering effect of a non-doped amorphous silicon and that of a non-doped polysilicon;

FIG. 16B is a characteristic diagram for comparing the Cu gettering effect of a boron-doped amorphous silicon and that of a boron-doped polysilicon;

FIG. 16C is a characteristic diagram for comparing the gettering effect of a non-doped amorphous silicon and that of a boron-doped amorphous silicon;

FIG. 17 is a characteristic diagram for explaining the relationship between electrically inactive boron and the gettering effect; and FIG. 18 is a cross sectional view showing a fourth embodiment of the present invention.

DETAILED DESCRIPTION OF THE PREFERRED EMBODIMENT

Figure 7:
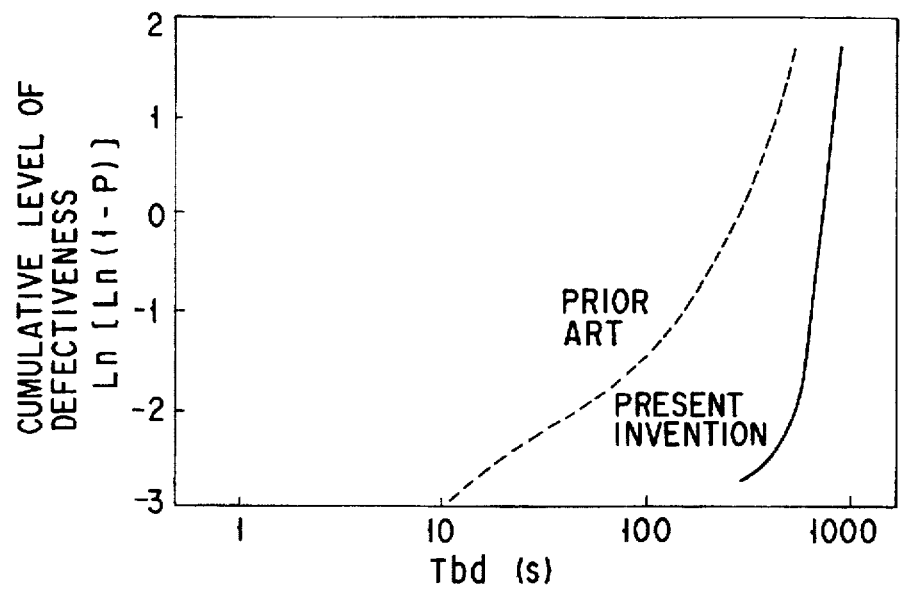
FIG. 7 is a graph showing the relationship between the time dependent dielectric breakdown duration and the cumulative level of defectiveness.

In the IG or BSP gettering, the thermal stability of a metal impurity in a gettering site is lower than that in the phosphorus gettering which utilizes the interaction between phosphorus and the metal impurity. More specifically, in the IG or BPS gettering, even if a wafer of a high temperature at 700° C. or higher is cooled to the room temperature at a controlled rate and the metal impurity is trapped near a BMD or a grain boundary of polysilicon, the metal impurity is discharged from the gettering site in the subsequent manufacturing steps. An element forming region is thus adversely affected again. For example, the trapped metal impurity is discharged from the gettering site in a sinter anneal step at a temperature of about 400° C. after a metal wire is formed, a step for forming an interlayer insulating film at a temperature of about 300° to 450° C., a step for forming a passivation film. Metal impurities having a relatively great diffusion coefficient, such as Cu, Ni, Ag, Au, Fe, particularly, Cu and Ni, adversely affect an element forming region even in low temperature processes. Thus, the IG or BSP gettering merely repeats trap and discharge of the metal impurity.

In terms of processes of gettering, when a low melting point metal, for example, aluminum is used as a metal wire material, it cannot be subjected to a heat treatment at a temperature higher than 600° C. after a metal wire forming step. Since, in the phosphorus gettering, a metal impurity is selectively removed from an element forming region into a back side of a silicon substrate by a heat treatment at about 800° C., the gettering must be executed before the metal wire forming step. In addition, since the process temperature becomes lower in accordance with the increase of the integration density of a semiconductor device, the phosphorus gettering, which requires a heat treatment at 800° C. or higher, will not be able to be employed, due to the inconsistency with the processes.

Further, when device characteristics of a semiconductor element in a form of a finished product after dicing, die bonding, wire bonding and packaging processes are evaluated, a high temperature accelerating test is performed at a relatively high temperature of 100° to 300° C. in order to analyze long term reliabilities such as a high temperature retaining characteristic. In the stage of evaluating device characteristics, the metal impurity, which has been trapped in an IG layer near an element activating layer, has an adverse effect on the device, i.e., it alters a charge retained time (pose time).

The present inventors have repeatedly studied the above problems, discovered that deposition sites of a metal impurity existing in an amorphous structure is much more than those existing in the IG or BSP gettering, and at last, achieved the present invention. That is, the present invention provides a semiconductor device comprising: a semiconductor substrate having first and second main surfaces and including a denuded zone, in which an oxygen concentration is lower than that in an inner portion of the semiconductor substrate and which does not include a bulk microdefect, and an intrinsic gettering zone; an element region formed on the first surface of the semiconductor substrate; and an extrinsic gettering layer, made of an amorphous semiconductor material which traps a metal impurity, and formed directly on at least a portion of the intrinsic gettering region or the entirely or partially thinned denuded zone of the second main surface of the semiconductor substrate. In the semiconductor device of the present invention, the metal impurity trapped by the EG layer preferably includes at least one of Cu, Ni, Ag, Au and Fe, having a great diffusion coefficient in a semiconductor substrate, for example, a silicon substrate. It is particularly preferable that at least one of Cu and Ni be included.

Further, it is preferable that the amorphous semiconductor material of the EG layer be amorphous silicon. It is also preferable that the amorphous semiconductor material contain an element which belongs to the group III or V of the periodic table of elements, for example, boron, phosphorus or arsenic. This is because in an amorphous structure, a metal impurity (e.g., Cu, Ni, Ag, Au or Fe) and an element which belongs to the group III or V of the periodic table interact with each other and the metal impurity trapped by this interaction has a higher thermal stability as compared to that in the IG or BSP gettering. The metal impurity is thus prevented from being discharged from the EG layer. Therefore, an element, which forms a stable substance with the metal element, such as Cu, Ni, Ag, Au or Fe, particularly Cu or Ni, can also be contained in the amorphous semiconductor material. The amount of an element contained in the amorphous semiconductor material is preferably $10^{20}$ atom/cc or more. If the amount is less than $10^{20}$ atom/cc, the gettering ability is gradually lowered.

In the semiconductor device of the present invention, the EG layer can be formed on the overall region or part of the semiconductor substrate. The EG layer, however, should be formed directly on the IG region or the entirely or partially thinned denuded zone of the semiconductor substrate in order to remove the metal impurity trapped in a surface in the denuded zone. The EG layer is die-bonded to a lead frame or the like, when the semiconductor substrate is diced so as to form a chip. The thickness of the EG layer is preferably 50 nm or more in order to maintain the gettering ability.

In the semiconductor device of the present invention, the element region has an electrode wire formed of a metal mainly containing at least one of Al, Cu, Ag and Au. The electrode wire means at least one of an electrode and a wire.

In the semiconductor device of the present invention, the denuded zone (hereinafter abbreviated as DZ) is a region in which the oxygen concentration is lower than that in the semiconductor substrate and a bulk microdefect is not contained. In a semiconductor substrate, such as a silicon substrate, a defect called a bulk microdefect is generated due to a heat treatment of the process of manufacturing a semiconductor substrate. The defect, which results from oxygen in the silicon substrate, is generally represented as $SiO_x$. In a surface region of the semiconductor substrate, oxygen is diffused outward during the heat treatment, so that the oxygen concentration in the surface region of the semiconductor substrate is lowered. As a result, a deposition core to be a bulk microdefect is eliminated, thereby forming a DZ. In general, oxygen of $1 \times 10^{18}$ (atom/cc), i.e., the concentration of the solid solubility limit at a monocrystal formed temperature of 1400° C., is dissolved in a silicon substrate in which crystals have been grown by Czochralski method. Therefore, in the surface region of the silicon substrate, oxygen is diffused outward to the solid solubility limit concentration due to the heat treatment in the semiconductor device manufacturing process, thereby eliminating the defect. As a result, the oxygen concentration in the surface region of the silicon substrate is lower than that in the inner region of the silicon substrate. FIG. 1 is a SIMS profile representing the oxygen concentration of a silicon substrate which is subjected to a heat treatment in the semiconductor device manufacturing process. The dependency of the outward diffusion of oxygen on the heat treatment is represented by the following equations 1 and 2.

$$C = C_0 + (C_s - C_0) \cdot erf(x/2(Dt)^{1/2}) \qquad 1$$

$$D = 0.13 \cdot erf(-2.53/kt) \qquad 2$$

$C_0$: initial interstitial oxygen concentration
$C_s$: surface oxygen concentration
D: diffusion coefficient of oxygen in the silicon substrate.

As described above, in the present invention, the DZ is defined as a region in which the oxygen concentration is lower than that in the inner portion of the semiconductor substrate and in which the bulk microdefect is eliminated.

The semiconductor device of the present invention is characterized in that the EG layer made of an amorphous semiconductor material is formed on the IG region or the entirely or partially thinned denuded zone on the back surface of the semiconductor substrate, particularly that the EG layer is made of an amorphous silicon film doped with boron. It is different from a conventional semiconductor device having a silicon substrate simply doped with boron, an epitaxial silicon film doped with boron or a polysilicon film doped with boron.

The present invention also provides a method for manufacturing a semiconductor device comprising the steps of: forming an element region of a first main surface of a semiconductor substrate having first and second main surfaces and including an intrinsic gettering zone; and forming an extrinsic gettering layer, made of an amorphous semiconductor material which traps a metal impurity, directly on at least a portion of the intrinsic gettering region or the entirely or partially thinned denuded zone of the second main surface of the semiconductor substrate.

In the method of the present invention, the step of forming an EG layer is preferably performed after a process of polishing the second main surface of the semiconductor substrate. The polishing process is to remove a polycrystalline semiconductor film, for example, a polycrystalline silicon film, formed on the second main surface of the semiconductor substrate as a gettering layer to trap a metal impurity. The polycrystalline semiconductor film easily discharges the metal impurity trapped therein and has a small capacity of the gettering site. Therefore, if the polycrystalline semiconductor film is once removed by the polishing process and an amorphous semiconductor material is deposited on the back surface (the second main surface) of the semiconductor substrate, the gettering capacity can be effectively improved and maintained. More specifically, while the surface of the element forming region is coated with a passivation film or the like, the back surface of the semiconductor substrate is polished to form a thin film, and then an EG layer, made of an amorphous semiconductor material doped with boron or the like, is formed on the back surface. As a result, the metal impurity, which has been mixed in the semiconductor substrate in or before the polishing process, can be removed from the semiconductor substrate by the EG layer.

In the method of the present invention, it is preferable that an electrode wire be formed in the element region on the first main surface of the semiconductor substrate, after the EG layer has been formed for the following reason: a metal impurity is adhered to the back surface or the edges thereof when a layer of a low melting point metal (e.g., Al, Al—Si—Cu, Cu, Ag or Au) is formed by means of sputtering or CVD method, but the metal impurity can be prevented from penetrating into the semiconductor substrate in a subsequent heat treatment. In this case, it is preferable the steps subsequent to the EG layer forming step be executed at a temperature controlled so as to keep the amorphous semiconductor material forming the EG layer in an amorphous site in order to prevent from reducing the amount of the gettering site. For example, if the amorphous semiconductor material is amorphous silicon, the temperature is controlled at 600° C. or lower in the subsequent steps. It is preferable that the gettering of the metal impurity performed under the controlled temperature, since amorphous silicon crystallizes to form polycrystalline silicon, so that the amount of gettering sites may be reduced, and the EG layer has a high gettering ability.

In the method of the present invention, the EG layer can be formed by low pressure chemical vapor deposition (LP-CVD). For example, a boron-doped amorphous silicon film, serving as the EG layer, can be formed by the LP-CVD, using diborane gas or disilane gas. In this case, since the EG layer can be formed at a low temperature of about 300° C., even if the layer is formed after the metal wire has been formed, no problem is raised.

According to the present invention, an amorphous semiconductor material is used as the EG layer. When the amorphous semiconductor material is used, the effect of gettering a metal impurity and the capacity of the gettering site are greater than in the conventional IG or BSP gettering. The EG layer therefore effectively traps the metal impurity deposited near the bulk microdefect in the IG region. Moreover, the trapped metal impurity (Cu, Ni, Ag, Au or Fe having a great diffusion coefficient) is not discharged even in a heat process in the subsequent steps, for example, a sinter anneal step at a temperature of about 400° C., a step for forming an interlayer insulating film at a temperature of about 300° to 450° C., or a step for forming a passivation film, and a high temperature accelerating test performed at a relatively high temperature of 100° to 300° C. to analyze long term reliabilities. Therefore, the amount of impurity penetrated into the element forming region can be reduced as compared to that in the IG or BSP gettering.

Further, in a case where the semiconductor substrate is diced to form a chip, even if the chip is subjected to a low-temperature heat treatment in a step of die-bonding an EG layer side of the chip to a lead frame, a wire bonding step or a packaging step, the metal impurity trapped in the EG layer does not diffused into the inner portion of the semiconductor substrate. Particularly in the semiconductor substrate, which has been polished to be a thin film, since the distance between the back surface of the substrate and the element forming region is short, resulting in short diffusion length of the metal impurity, the element region may likely be influenced by the metal impurity. However, since the metal impurity trapped by the EG layer is not discharged, the element can be sufficiently protected from an adverse influence by the metal impurity. Even if the metal impurity trapped by the IG layer is discharged therefrom by the aforementioned low-temperature heat treatment, it can be trapped by the EG layer. Therefore, the amount of the metal impurity diffused in the element forming region of the surface region of the semiconductor substrate is greatly reduced.

Embodiments of the present invention will be described in detail with reference to the accompanying drawings.

(First Embodiment)

FIG. 2 is a cross sectional view of a semiconductor device according to a first embodiment of the present invention. A reference numeral 101 denotes a silicon substrate in which elements, such as a transistor and a capacitor, are formed. An amorphous silicon film 102 doped with an impurity, boron in an amount of $10^{21}$ atom/cc, is formed on a back surface of the silicon substrate 101. The amorphous silicon film 102 is directly formed on an IG layer of the silicon substrate 101. Source and drain diffusion layers 103 are formed in a main surface of the silicon substrate 101. A gate electrode 110 is formed on a gate oxide film 109 which is formed on a channel region between the source and drain diffusion layers 103. A trench is formed beside the source and drain diffusion layers 103. A capacitor electrode 106 is formed in the trench and connected to the source and drain diffusion layers 103. A capacitor electrode 108 is formed inside the capacitor electrode 106 with an insulating film 107 interposed therebetween. A gate electrode 112 is formed above the capacitor electrode 108 with a gate oxide film 109 interposed therebetween. The capacitor electrode 106 and the silicon substrate 101 are electrically insulated from each other by an insulating film 105. On the gate oxide film 109, a metal wire 111, an interlayer insulating film 117, a metal layer insulating film 116, a metal wire 115 and an insulating film 114 are accumulated in this order. A reference numeral 104 denotes a field oxide film.

With the semiconductor device having the above structure, even when the silicon substrate was diced to form a chip and the chip was subjected to a low-temperature heat treatment in a step of die bonding the amorphous silicon film 102 to a lead frame, a wire bonding step and a packaging step, a metal impurity trapped by the amorphous silicon 102 did not diffused into the inner portion of the silicon substrate and the amount of the metal impurity penetrated in an element forming region was reduced as compared to that in the IG or BSP gettering.

To confirm the effect of the invention, semiconductor wafers (hereinafter referred to as wafer), contaminated with Cu in a forced manner, were prepared. The thermal stability in the gettering using an amorphous silicon film doped with boron, serving as the EG layer, was compared with that in the conventional BSP gettering. More specifically, a boron-doped amorphous silicon film of a thickness of 0.1 μm was formed on the back surface of the wafer contaminated with Cu. A BSP gettering layer of a thickness of 0.1 μm was formed on the back surface of the wafer contaminated with Cu. These samples were heated to various temperatures in a nitrogen atmosphere, so that Cu could be sufficiently diffused. Subsequently, the samples were quenched to the room temperature.

FIG. 3 is a graph showing the relationship between the heat treatment temperature (gettering process temperature) in the abscissa and the gettering effect $(1-\tau_0/\tau)$ (%) obtained by SPV (Surface Photovoltage) method in the ordinate. $\tau_0$ represents a lifetime of a minority carrier in the contaminated wager (which has not been subjected to the gettering process). τ represents a lifetime of a minority carrier in the wafer which has been subjected to the gettering process. As evident from FIG. 3, the sample having the amorphous silicon film (the present invention) has a higher gettering effect than the sample having the BSP gettering layer (the prior art). It is thus clarified that, in the BSP gettering, the metal impurity is discharged from the gettering layer even in the low-temperature process at 300° to 600° C., whereas in the gettering of the present invention, discharge of the metal impurity is suppressed by the amorphous silicon film, with the result that the metal impurity can be satisfactorily trapped in the gettering site.

Although not shown in FIG. 3, the more the amount of metal contaminant, the more the difference in gettering effect between the present invention and the prior art. The difference is also increased, when the gettering layer is thinner than 0.1 μm. This is because boron doped in the amorphous silicon and the metal impurity chemically interact with each other and the amorphous silicon has a sufficient amount of deposition site.

Using the above wafers, an amount of Cu trapped by a gettering site in the boron-doped amorphous silicon film of the present invention and that in the conventional BSP gettering, during a heat treatment at 400° C. in a nitrogen atmosphere, were detected by SIMS analysis. The results of the analysis are shown in FIGS. 4A and 4B. As evident from FIGS. 4A and 4B, a larger amount of Cu was trapped in the gettering using the boron-doped amorphous silicon film (FIG. 4A) than in the BSP gettering (FIG.4B). Thus, the present invention is more advantageous than the BSP gettering both in the thermal stability (the metal impurity discharge characteristic) and the capacitance (the amount of gettering site).

Next, a SRAM having an EG layer made of an amorphous semiconductor material on its back surface (the present invention) and a SRAM having no gettering layer (the prior art) were prepared. The pn junction leakage current characteristics of both SRAMs were detected. The results are shown in FIG. 5. As evident from FIG. 5, since the metal impurity is sufficiently trapped in the SRAM according to the present invention, the leakage current is less than that in the conventional SRAM, with the result that satisfactory element characteristics are obtained. The reason why the leakage current in the SRAM of the prior art is greater is considered to be that the metal impurity, which serves as a generation center of charge, exists in a depletion layer of the pn junction.

Next, a DRAM having an EG layer made of an amorphous semiconductor material on its back surface (the present invention) and a DRAM having no gettering layer (the prior art) were prepared. The dependencies of the charge retained time on the high temperature maintained time (the time in which the DRAM is maintained at a high temperature?) for both DRAMs were examined. The results are shown in FIG. 6. As evident from FIG. 6, the DRAM according to the present invention has no dependency on the high temperature maintained time and keeps a satisfactory charge retaining characteristic, since no metal impurity exists in the inner portion of the silicon substrate and the interface between the capacitor insulating film and the silicon substrate. On the other hand, in the conventional DRAM, the charge retaining characteristics become poorer with the increase of the high temperature maintained time. This would be due to the fact that the metal impurity, which serves as a leakage center of charge, exists in a diffusion layer of the capacitor portion in the silicon substrate.

Next, an EEPROM having an EG layer made of an amorphous semiconductor material on its back surface (the present invention) and an EEPROM having no gettering layer (the prior art) were prepared. The low current TDDB (Time Dependent Dielectric Breakdown) of each EEPROM was measured through a high temperature accelerating test for a tunnel oxide film. Based on the results of the measurement, the relationship between the time dependent dielectric breakdown duration and the cumulative proportion defective was examined. The relationship is shown in FIG. 7. The time dependent dielectric breakdown duration (Tbd) is represented as a Weibull plot. As evident from FIG. 7, in the EEPROM according to the present invention, since the metal impurity, which may be a core of an accidental defect, is effectively removed, the time dependent dielectric breakdown duration was increased and the reliability of the tunnel oxide film was improved. On the other hand, in the conventional EEPROM, the time dependent dielectric breakdown duration was unsatisfactory. This would be due to the fact that the metal impurity, which may be a core of an accidental defect, exists in the tunnel oxide film or the interface between the silicon substrate and the tunnel oxide film.

As described above, the element formed on the main surface of the semiconductor substrate can be of any structure of a DRAM, SRAM and EEPROM.

(Second Embodiment)

Figure 8A:
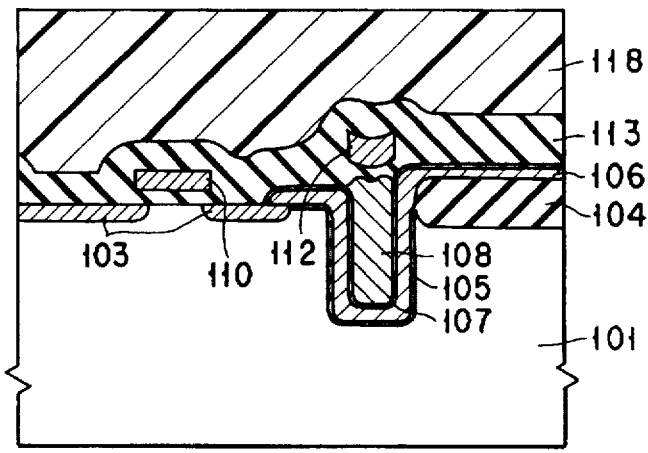
FIGS. 8A and 8B are cross sectional views for explaining an example of the process of manufacturing a semiconductor device according to a second embodiment of the present invention.
Figure 8B:
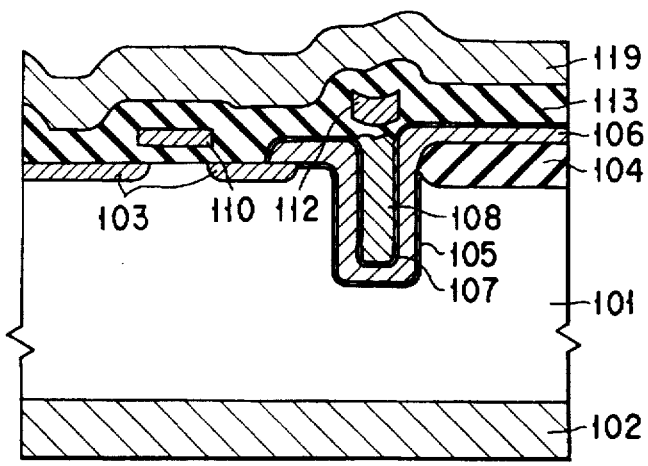

FIGS. 8A and 8B are cross sectional views for explaining a process for manufacturing a semiconductor device according to a second embodiment of the present invention. In FIGS. 8A and 8B, the same elements as shown in FIG. 2 are identified with the same reference numerals as used in FIG. 2 and descriptions thereof are omitted. Although an electrode wiring layer is not shown in FIGS. 8A and 8B, it is formed in subsequent steps on source and drain diffusion layers 103 via a contact hole.

In this embodiment, a boron-doped amorphous silicon film is formed directly on the back surface of a silicon substrate, after elements are formed on the main surface of the silicon substrate and before the electrode wiring layer is formed. As shown in FIG. 8A, a photoresist 118 is formed on an interlayer insulating film 113, and a polysilicon film and an oxide film formed the back surface of the silicon substrate are entirely removed by chemical dry etching (CDE), wet etching or the like, so that the back surface of the silicon substrate is exposed.

Then, after the photoresist 118 is removed as shown in FIG. 8A, a boron-doped amorphous silicon film 119 is formed directly on an IG region on the main surface of the silicon substrate at a temperature of 300° C. by, for example, LP-CVD. Further, the boron-doped amorphous silicon film 119 formed on the main surface of the silicon substrate is removed. Thereafter, a contact hole is formed in the region above the source and drain diffusion layers 103 by etching. An electrode wiring layer is formed in the region.

In the semiconductor device having the above structure, since an EG layer is formed on the back surface of the silicon substrate, a gettering site of the EG layer can sufficiently trap a metal impurity discharged from the IG region in low-temperature heat treatment, such as a sinter anneal step at a temperature of about 400° C., a step for forming an interlayer insulating film at a temperature of about 300° to 450° C., or a step for forming a passivation film. For this reason, the amount of the metal impurity penetrated into the element forming region of the main surface side of the silicon substrate can be suppressed. In addition, since the boron-doped amorphous silicon film (the EG layer) is formed immediately before a metal wire is formed, the metal impurity, which is adhered to the back surface of the edges whereof when a metal wire made of a low melting point metal (e.g., Al, Al—Si—Cu, Cu, Ag or Au) is formed by means of sputtering or CVD method, does not penetrate into the semiconductor substrate.

(Third Embodiment)

Figure 9A:
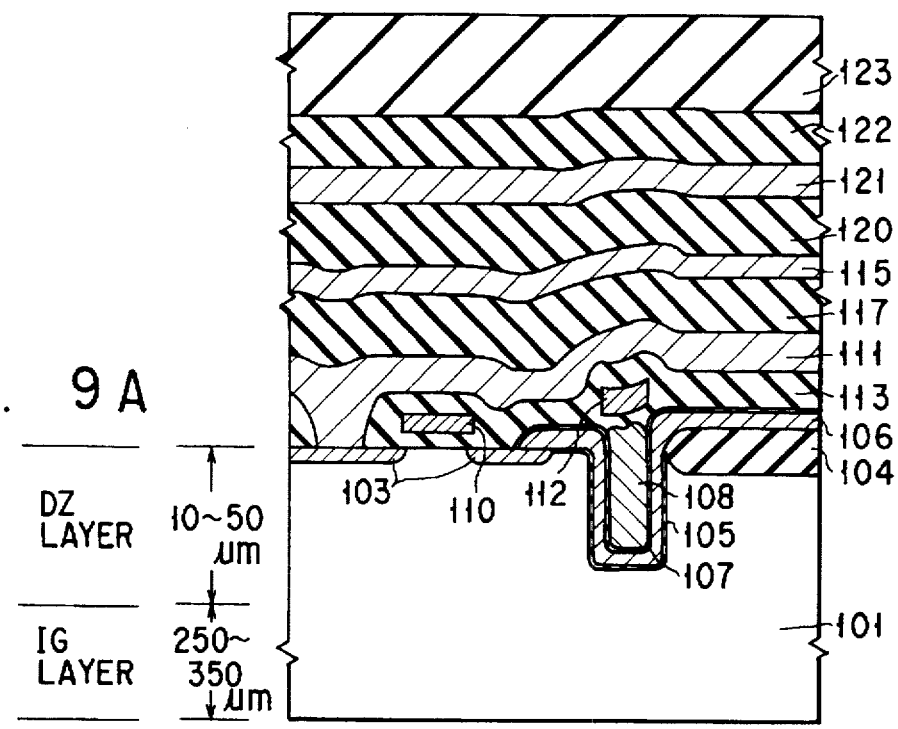
FIGS. 9A and 9B are cross sectional views for explaining an example of the process of manufacturing a semiconductor device according to a third embodiment of the present invention.
Figure 9B:
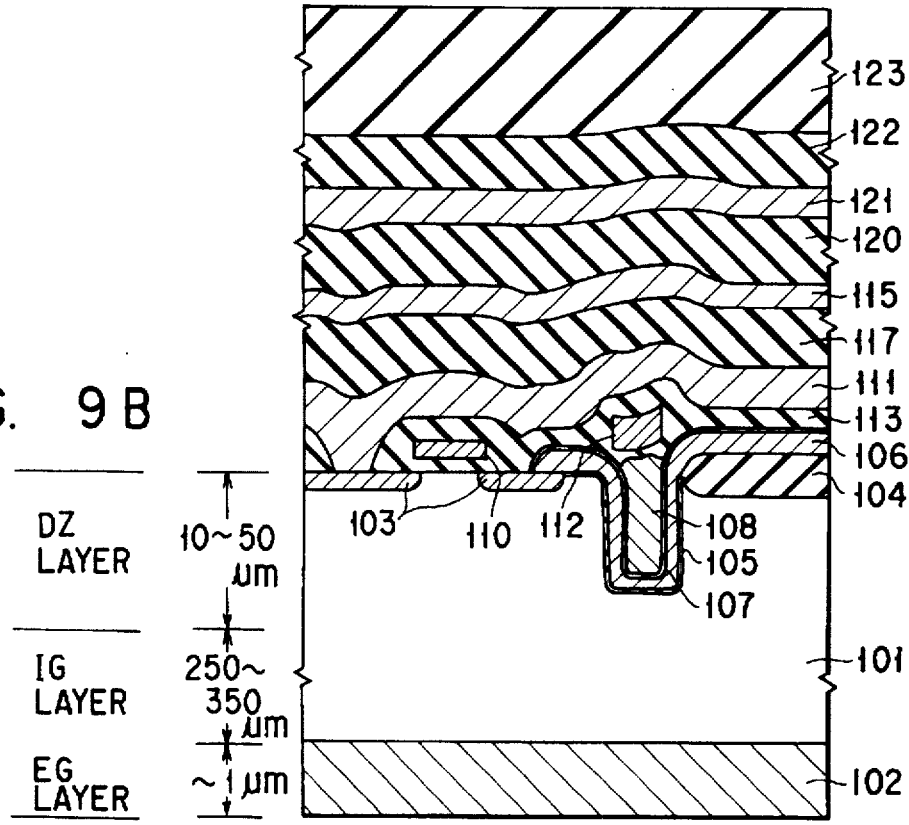

FIGS. 9A and 9B are cross sectional views for explaining a process for manufacturing a semiconductor device according to a third embodiment of the present invention. In FIGS. 9A and 9B, the same elements as shown in FIG. 2 are identified with the same reference numerals as used in FIG. 2 and descriptions thereof are omitted.

A metal wire 121, interlayer insulating films 120 and 122, and a passivation film 123 are formed on a silicon substrate 101, and thereafter the back surface of the silicon substrate is polished. More specifically, the silicon substrate, having the thickness of about 600 μm, is polished to be about 300 to 400 μm thick. The resultant structure is shown in FIG. 9A. In the silicon substrate 101, a DZ layer is formed to a depth of about 50 μm in the main surface side (the element forming region side). An IG layer, including a bulk microdefect, is formed between the DZ layer, and the back surface of the silicon substrate. A DZ layer, which has been formed on the back surface of the silicon substrate 101, is removed by the polishing process.

As shown in FIG. 9B, a boron-doped amorphous silicon film 102 (an EG layer) is formed on the back surface of the silicon substrate 101 so as to be in direct contact with the IG layer. The born-doped amorphous silicon film can be formed easily by any method, for example, the LP-CVD method and the sputtering method.

Even if the EG layer is formed after the metal wire is formed as described above, a metal impurity inside or outside of the silicon substrate can be trapped by the EG layer in a sinter anneal step at a temperature of about 400° C., a step for forming an interlayer insulating film at a temperature of about 300° to 450° C., or a step for forming a passivation film. Moreover, the metal impurity (Cu, Ni, Ag, Au or Fe having a great diffusion coefficient, particularly Cu and Ni) trapped in the EG layer is prevented from penetrating into the element forming region.

As described above, the surface of the element forming region is coated with the passivation film and the back surface of the silicon substrate is polished to form a thinner film. Thereafter, the EG layer of the boron-doped amorphous silicon film is formed on the back surface of the silicon substrate. Even when the silicon substrate is diced to form a chip and the chip is subjected to a low-temperature the treatment in a step of die bonding the chip to a lead frame, a wire bonding step and a packaging step, a metal impurity existing in the silicon substrate in the polishing process is prevented from being diffused into an inner portion of the substrate. Even if the metal impurity trapped in the IG layer is discharged therefrom by a low-temperature heat treatment, it can be trapped by the EG layer on the back surface of the substrate. Therefore, the amount of metal impurity, which is diffused into the element forming region of the surface region of the silicon substrate, can be reduced.

Figures 10A, 10B:
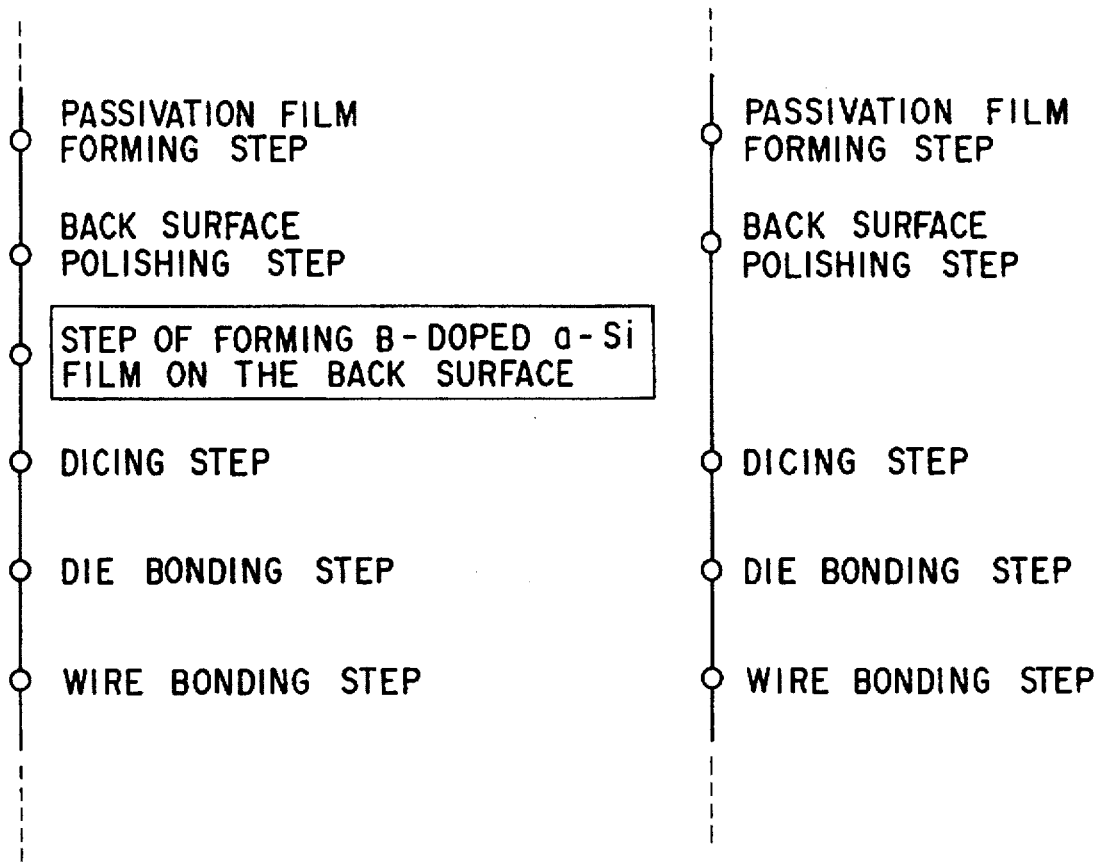
FIG. 10A is a process flow of the method for manufacturing a semiconductor device according to the present invention.
FIG. 10B is a process flow of the method for manufacturing a semiconductor device according to the conventional art.

FIGS. 10A and 10B show process flows of the manufacturing process of the present invention and the conventional manufacturing process. As shown in FIG. 10A, according to the present invention, since the boron-doped amorphous silicon film is formed so as to be in direct contact with the back surface of the silicon substrate, the metal impurity can be effectively trapped by the EG layer and prevented from penetrating into the element forming region. On the other hand, according to the conventional art, as shown in FIG. 10B, in a packaging step, the substrate is diced to from a chip after the back side polishing step and thereafter the die bonding step is performed. Subsequently, a wire bonding step is performed. In this conventional manufacturing process, since the substrate is subjected to the die bonding at a temperature of 100° to 300° C., in a state where the metal impurity in a solvent used in the back surface polishing is adhered to the back surface of the substrate, the metal impurity is diffused into the silicon substrate. Further, when the packaging step is completed, the semiconductor device is subjected to an accelerating test at a temperature of 100° to 300° C. for a long period of time to check the long term reliability of the device. Since the metal impurity trapped near the bulk microdefect in the IG layer is discharged during the test, the element forming region is adversely affected. As shown in FIG. 10A, the step of forming the boron-doped amorphous silicon film on the back surface of the silicon substrate is performed after the back surface polishing step and before the dicing step. However, the boron-doped amorphous silicon film can be formed after the dicing step according to the gist of the present invention.

The process flows shown in FIGS. 10A and 10B will be described in detail with reference to the drawings.

Figure 11A:
FIGS. 11A to 11E are diagrams for explaining the process shown in FIG. 10B.
Figure 11B:
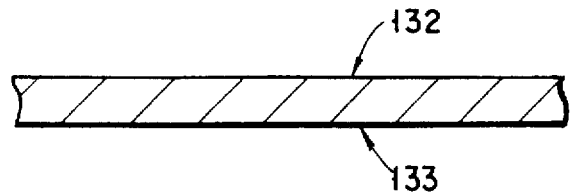
Figure 11C:
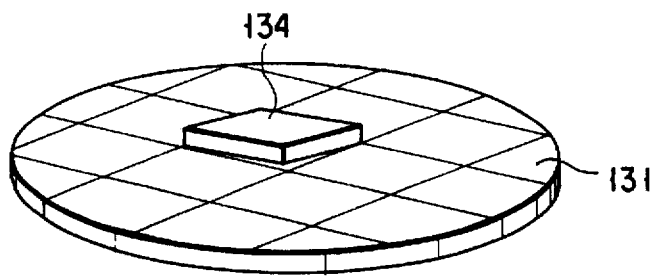
Figure 11D:
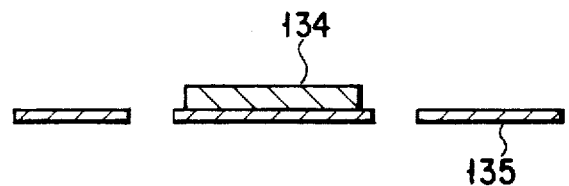
Figure 11E:
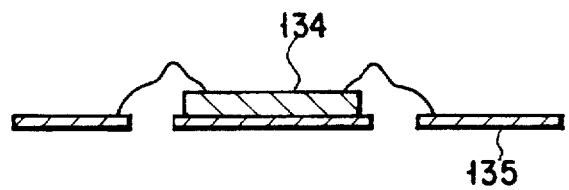

In the conventional method shown in FIG. 10B, the rear surface of a silicon substrate 131 (FIG. 11A), on which a passivation film is formed, is subjected to lapping, thereby thinning the silicon substrate as shown in FIG. 11B. In FIG. 11B, a reference numeral 132 denotes the main surface on which a device is formed, and a reference numeral 133 denotes the rear surface. As shown in FIG. 11C, the silicon substrate 131 is subjected to dicing so that a chip 134 is cut out from the wafer. Then, as shown in FIG. 11D, the chip 134 is die-bonded onto a substrate 135, such as a lead frame or a ceramic substrate. Subsequently, as shown in FIG. 11E, the chip 134 and the substrate 135 are electrically connected to each other by wire bonding in an electrode wiring step.

In the method of the present invention shown in FIG. 10A, the rear surface of a silicon substrate 141 (FIG. 12A), on which a passivation film is formed, is subjected to lapping, thereby thinning the silicon substrate as shown in FIG. 12B. In FIG. 12B, a reference numeral 142 denotes the main surface on which a device is formed, and a reference numeral 143 denotes the rear surface. A boron-doped amorphous silicon film 144 is formed on the rear surface 143 of the silicon substrate 141. The boron-doped amorphous silicon film 144 can be formed by LP-CVD (Low-Pressure Chemical Vapor Deposition) in a heat process at a temperature of 300° C. Therefore, the wafer can be processed to from the film 144, even after a metal wiring step or a passivation step has been completed.

Then, as shown in FIG. 12D, the silicon substrate 141 is subjected to dicing so that a chip 145 is cut out from the wafer. Thereafter, as shown in FIG. 12E, the chip 145 is die-bonded onto a substrate 146, such as a lead frame made of copper or an iron-nickel alloy, or a ceramic substrate made of aluminum oxide. Subsequently, as sown in FIG. 12F, the chip 145 and the substrate 146 are electrically connected to each other by wire bonding in an electrode wiring step.

Figure 13:
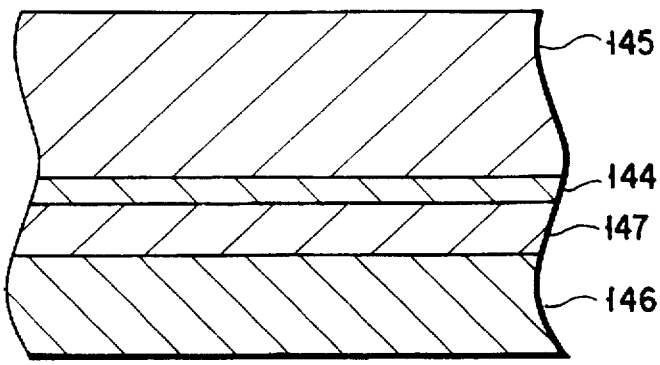
FIG. 13 is a cross sectional view showing a semiconductor device obtained by the process shown in FIGS. 12A to 12F.

FIG. 13 shows the structure of the semiconductor device obtained by the processes as described above. The boron-doped amorphous silicon film 144 of the chip 145 is adhered by a die-bonding material 147 to the substrate 146. An active circuit (not shown) is formed on the chip 145.

The following can be used as the die-bonding material: solder made of an Au—Sn alloy, a Pb—Ag—In alloy, a Pb—Ag—Sn alloy, a Pb—Sn alloy, and Au—Ge alloy or an Au—Si alloy; a resin such as an epoxy resin or a polymide adhesive; and the resin to which metal, such as silver, is added. The lead frame (the substrate 146) can be formed of copper, a copper-base alloy, an iron-nickel alloy or the like. The ceramic substrate (the substrate 146) can be formed of $Al_2O_3$ (90–99%), BeO, AlN or the like.

FIG. 14A is a characteristic diagram showing a data retaining characteristic of the conventional dynamic random access memory (DRAM) obtained by the process shown in FIGS. 11A to 11E, and FIG. 14B is a characteristic diagram showing a data retaining characteristic of a DRAM according to the present invention obtained by the process shown in FIGS. 12A to 12F. As evident from FIGS. 14A and 14B, the conventional DRAM (FIG. 14A) has failure bits in which the retaining characteristic is considerably degraded, whereas the DRAM (FIG. 14B) of the present invention does not have failure bits in which the retaining characteristic is considerably degraded. Thus, the semiconductor device of the present invention has an excellent gettering effect due to the boron-doped amorphous silicon film 144.

In addition, according to the process of the present invention (FIGS. 12A to 12F), a wafer with a degraded characteristic due to an impurity element can be remedied. The date retaining characteristic of a DRAM is evaluated first, before the dicing process to cut the wafer into chips. Thereafter, a boron-coped amorphous silicon film is formed on the rear surface of the wafer. Then, the data retaining characteristic of the DRAM is evaluated again. FIG. 15A shows the data retaining characteristic of the DRAM in the first evaluation, and FIG. 15B shows that of the DRAM having the boron-doped amorphous silicon film. Thus, according to the present invention, the degraded characteristic can be remedied by the boron-doped amorphous silicon film formed on the rear surface of the wafer. As a result, since only the wafers which clear the characteristic specification can be transferred to the dicing process, the manufacturing yield can be improved.

Next, the mechanism how the boron-doped amorphous silicon film provides the excellent gettering effect will be explained.

Conventionally, it has been reported that gettering of a polysilicon film is achieved by precipitation of a metal impurity at at grain boundary, and particularly that the gettering efficiency of the metal impurity has a relation to the crystal orientation of a polysilicon film. The present inventors analyzed the gettering characteristic of a boron-doped polysilicon film in detail, and discovered that metal impurities are got by particles, i.e., within grains, of the polysilicon film.

The present inventors further analyzed the relationship between the state of boron and the gettering effect (under the conditions of annealing at the temperature of 500° C. in $N_2$ atmosphere) by SIMS. As shown in FIG. 16A, in a state of non-boron, the polysilicon film has a higher gettering effect as compared to the amorphous silicon film (which has substantially no gettering effect). In a boron-doped state, however, as shown in FIG. 16B, the amorphous silicon has a higher gettering effect as compared to the polysilicon film. In an amorphous silicon film, as shown in FIG. 16C, the gettering effect is particularly high in a state where boron is doped. In FIGS. 16A, 16B and 16C, the gettering effects with respect to Cu are shown.

Boron introduced in silicon lattices, i.e., electrically active boron, and boron in positions between silicon lattices (electrically inactive boron) are introduced in the polysilicon film. On the other hand, in amorphous silicon, boron is not introduced in silicon lattices. Therefore, the amorphous silicon film contains a great amount of electrically inactive boron. Based on this fact and the results shown in FIGS. 16A and 16B, it is considered that the greater the amount of electrically inactive boron, the higher the gettering effect where the total concentration of boron the amorphous silicon film is the same as that in the polysilicon film.

As shown in FIG. 17, while the concentration of electrically active boron is constant (triangular plots in FIG. 17), the gettering effect becomes higher as the boron concentration increases (circular plots in FIG. 17). This means that the gettering effect does not depend on electrically active boron, i.e., it depends on electrically inactive boron. In FIG. 17, the boron concentration of $10^{20}$ atoms/cm³ is a solid solution limit of boron determined by $N_2$ annealing at 1000° C.

Further, an influence of electrically inactive boron on the gettering effect was investigated, in a case where, before gettering, the concentration of Fe contamination in the silicon substrate is $5 \times 10^{12}$ atoms/cm³ and the total concentration of boron in the boron-doped amorphous silicon film is $1 \times 10^{21}$ atoms/cm³. After $N_2$ annealing at 800° C., the concentration of electrically active boron is $4 \times 10^{20}$ atoms/cm³, the concentration of electrically inactive boron is $6 \times 10^{20}$ atoms/cm³ and the concentration of Fe contamination in the silicon substrate is $2 \times 10^{11}$ atoms/cm³. On the other hand, after $N_2$ annealing at 1000° C., the concentration of electrically active boron is $1 \times 10^{20}$ atoms/cm³, the concentration of electrically inactive boron is $9 \times 10^{20}$ atoms/cm³ and the concentration of Fe contamination in the silicon substrate is $2 \times 10^{10}$ atoms/cm³. Thus, it is found that a high gettering effect is obtained when the concentration of electrically inactive boron is high in a case where the total concentration of boron is the same.

As described above, for the purpose of efficient gettering of metal impurities, no grain boundary is required and it is necessary that boron be electrically inactive. It follows that a boron-doped amorphous silicon film is effective as a gettering. Although the above analysis was performed in the case of the metal impurity Cu or Fe, the same effect was obtained with respect to the other metal impurity, e.g., Ni.

(Fourth Embodiment)

In this embodiment, the present invention is applied to a liquid crystal device. In general, an amorphous silicon thin film or a polysilicon film is deposited on a glass substrate and a device (e.g., a transistor) is formed in the film. Since the glass is used as the material of the substrate, the process temperature is limited to about 600° C. or lower, unlike in the case of a silicon device. The glass substrate contains a metal impurity, such as Na, Cu or Fe, which degrades the performance of the device. In the liquid crystal device according to this embodiment, the amount of metal impurity, penetrated from the glass substrate to a device active layer formed on the main surface of the substrate, can be reduced.

FIG. 18 shows a device in which a boron-doped amorphous silicon film 152, i.e., an EG layer, is formed on the back surface of a glass substrate 151. The boron-doped amorphous silicon film 152 is formed by deposition at a temperature of 300° C. using diborane gas and disilane gas by means of the LP-CVD method. A thin film transistor is formed in the boron-doped amorphous silicon film 152. In the device having the structure shown in FIG. 18, since the metal impurity in the glass substrate is trapped by the EG layer formed on the back surface of the substrate, the performance and the manufacturing yield of the thin film transistor formed on the back surface of the glass substrate can be improved.

The present invention is not limited to the above structures and methods according to the first to fourth embodiments. Elements other than amorphous silicon, which belong to the group IV of the periodic table (e.g., amorphous germanium, amorphous silicon germanium and amorphous silicon carbide) can be used as the amorphous semiconductor material. It is preferable that the amorphous semiconductor material contain an impurity of an element which belongs to the group III or IV of the periodic table of elements. However, an element, which forms a stable substance with the metal element such as Cu, Ni, Ag, Au or Fe, particularly Cu or Ni, can also be contained in the amorphous semiconductor material. Further, various modifications can be made within the spirit and scope of the present invention.

As described above, according to the present invention, electric characteristics of the semiconductor device can be prevented from being degraded even in a low-temperature process at 600° C. of lower or a high accelerating test to assure the long term reliability of the device. In addition, since the metal impurity trapped in the EG layer is not discharged therefrom even after the heat treatment in subsequent steps, the metal impurity is prevented from penetrating in an element active layer for a long period of time, thereby ensuring the long term reliability of the semiconductor device.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:
   a semiconductor substrate having first and second main surfaces, a denuded zone in which an oxygen concentration is lower than an oxygen concentration of an inner portion of the semiconductor substrate, and an intrinsic gettering zone;
   an element region formed on the first main surface of the semiconductor substrate;
   an extrinsic gettering film made of an amorphous semiconductor material which traps a metal impurity and formed directly on at least a portion of the second main surface of the semiconductor substrate; and
   an electrode-wiring layer made of a metal and formed on said element region,
   wherein the amorphous semiconductor material contains boron of a concentration of $10^{20}$ atoms/cm$^3$ or more.

2. The semiconductor device according to claim 1, further comprising a supporting substrate on which said semiconductor substrate is mounted with said extrinsic gettering film positioned between said supporting substrate and said semiconductor substrate.

3. The semiconductor device according to claim 2, wherein said supporting substrate is one selected from the group consisting of a lead frame and a ceramic substrate.

4. The semiconductor device according to claim 3, wherein said lead frame is made of a metal selected from the group consisting of copper, a copper based alloy, and an iron-nickel alloy.

5. The semiconductor device according to claim 3, wherein said ceramic substrate is made of a material selected from the group consisting of $Al_2O_3$, BeO, and AlN.

6. The semiconductor device according to claim 2, wherein said semiconductor device is adhered to said supporting substrate by a die-bonding material.

7. The semiconductor device according to claim 6, wherein said die-bonding material is a material selected from the group consisting of a solder and a resin.

* * * * *